United States Patent
Kim et al.

(10) Patent No.: US 7,936,002 B2
(45) Date of Patent: May 3, 2011

(54) MULTIPLE-LAYER NON-VOLATILE MEMORY DEVICES, MEMORY SYSTEMS EMPLOYING SUCH DEVICES, AND METHODS OF FABRICATION THEREOF

(75) Inventors: Jonghyuk Kim, Osan (KR); Han-Soo Kim, Suwon (KR); YoungSeop Rah, Yongin (KR); Min-sung Song, Seoul (KR); Jang Young Chul, Yongin (KR); Soon-Moon Jung, Seongnam (KR); Wonseok Cho, Suwon (KR)

(73) Assignee: Samsung Electronics Co., Ltd. (KR)

( * ) Notice: Subject to any disclaimer, the term of this patent is extended or adjusted under 35 U.S.C. 154(b) by 35 days.

(21) Appl. No.: 12/456,391

(22) Filed: Jun. 16, 2009

(65) Prior Publication Data

US 2009/0315095 A1    Dec. 24, 2009

(30) Foreign Application Priority Data

Jun. 20, 2008   (KR) .......................... 10-2008-0058511

(51) Int. Cl.
| | |
|---|---|
| H01L 29/76 | (2006.01) |
| H01L 31/036 | (2006.01) |
| H01L 31/112 | (2006.01) |
| H01L 29/94 | (2006.01) |
| H01L 31/062 | (2006.01) |

(52) U.S. Cl. ........... 257/314; 257/390; 257/67; 257/368
(58) Field of Classification Search .................. 257/314, 257/67, 241, 330, 332, 368, 377, 385, 250, 257/266, 231, 278, 390
See application file for complete search history.

(56) References Cited

U.S. PATENT DOCUMENTS

| | | | |
|---|---|---|---|
| 5,949,092 A | 9/1999 | Kadosh et al. | |
| 2004/0005755 A1* | 1/2004 | Moniwa et al. | ............... 438/222 |
| 2007/0047371 A1 | 3/2007 | Park et al. | |
| 2007/0181880 A1 | 8/2007 | Kim | |

FOREIGN PATENT DOCUMENTS

| | | |
|---|---|---|
| KR | 100634459 B1 | 10/2006 |
| KR | 100737920 B1 | 7/2007 |

* cited by examiner

*Primary Examiner* — Chuong A. Luu
(74) *Attorney, Agent, or Firm* — Mills & Onello, LLP

(57) ABSTRACT

In multiple-layered memory devices, memory systems employing the same, and methods of forming such devices, a second memory device layer on a first memory device layer comprises a second substrate including a second memory cell region. The second substrate includes only a single well in the second memory cell region, the single well of the second memory cell region comprising a semiconducting material doped with impurity of one of a first type and second type. The single well defines an active region in the second memory cell region of the second substrate. Multiple second cell strings are arranged on the second substrate in the second active region. Although the second memory cell region includes only a single well, during a programming or erase operation of the memory cells of the second layer, requiring a high voltage to be applied to the single well in the substrate of the second layer, the high voltage will not interfere with the operation of the peripheral transistors of the first layer, second layer, or other layers, since they are isolated from each other. As a result, the substrate of the second layer can be prepared to have a thinner profile, and with fewer processing steps, resulting in devices with higher-density, greater reliability, and reduced fabrication costs.

8 Claims, 15 Drawing Sheets

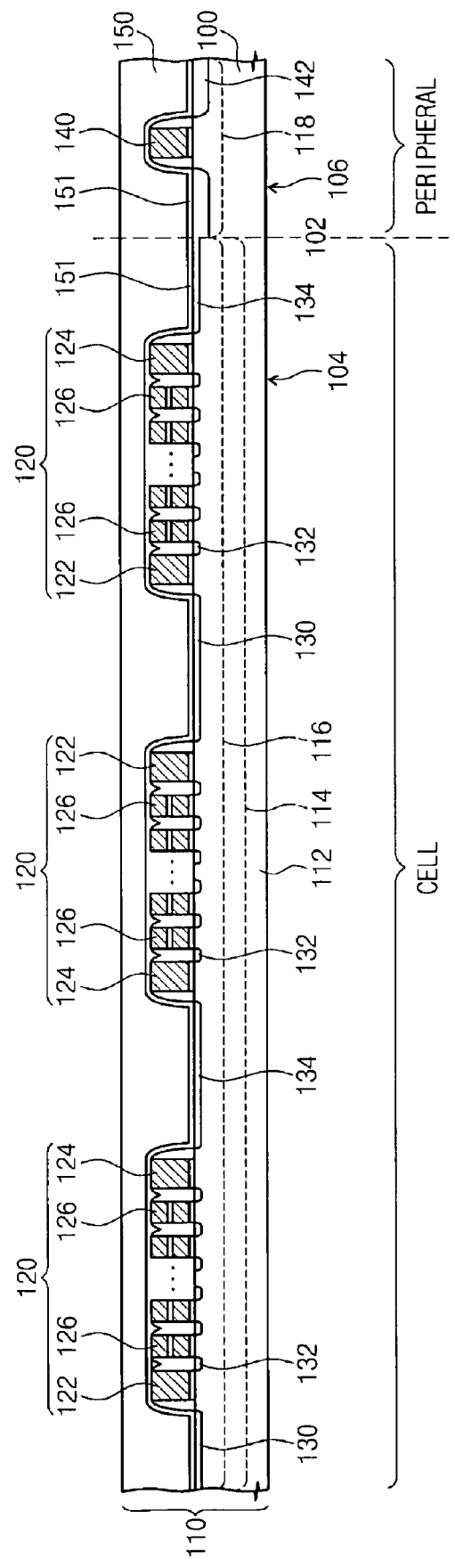

__US 7,936,002 B2__

MULTIPLE-LAYER NON-VOLATILE MEMORY DEVICES, MEMORY SYSTEMS EMPLOYING SUCH DEVICES, AND METHODS OF FABRICATION THEREOF

RELATED APPLICATIONS

This application claims priority under 35 U.S.C. 119 to Korean Patent Application No. 10-2008-0058511, filed on Jun. 20, 2008, the content of which is incorporated herein by reference in its entirety.

BACKGROUND

With the continued emphasis on highly integrated electronic devices, there is an ongoing need for semiconductor memory devices that operate at higher speeds and lower power and that have increased device density. To accomplish this, devices with aggressive scaling and multiple-layered devices with transistor cells arranged in horizontal and vertical arrays have been under development.

In one approach, planar memory cells, for example NAND memory cells, are formed in a conventional horizontal, or planar, array. Multiple horizontal arrays are then stacked in a vertical direction, resulting in a three-dimensional device configuration.

In the conventional planar NAND memory configuration, memory cells are arranged in a high-density array in a memory cell region of the device, and peripheral transistors of relatively lower density are arranged in a peripheral region of the device. The memory cells and peripheral transistors are arranged on the device substrate in regions of the substrate referred to as wells, which are regions that are doped with a particular type of impurity.

In the memory cell region, the memory cells are positioned on the substrate in a pocket well that surrounds the memory cells; the pocket well is in turn positioned in a deep well. In an example where the substrate is a p-type substrate, the deep well can be n-type, and the pocket well can be p-type. At the same time, in the peripheral circuit region, the peripheral transistors are positioned on the substrate in a peripheral well, which can be n-type or p-type. Combining the pocket well and deep well in the memory cell region and the peripheral well in the peripheral region, such a well configuration is referred to as a "triple well" configuration.

During a program or erase operation of a non-volatile memory device, a high voltage is typically applied to the pocket well in the memory cell region of the device. The peripheral region must therefore be isolated from the memory cell region during this operation in order to avoid interference with the peripheral region during the program or erase operation, since the memory region and peripheral region share a common substrate. The presence of the deep well in the memory cell region provides this isolation function.

With the desire for increased density in electronic devices, formation of multiple-layered devices continues to become more attractive to semiconductor manufacturers. However, the need for a deep well in the memory cell region of each layer can increase manufacturing costs and can limit device density in the vertical direction of a multiple-layered device.

SUMMARY

Embodiments of the present invention are directed to multiple-layered semiconductor devices, memory systems employing such devices, and methods of forming semiconductor devices having multiple layers whereby the upper layers of the multiple-layered device comprise a memory cell region including only a single well. As a result, the devices can be formed to have increased vertical density, and can be formed more efficiently by reducing the number of manufacturing steps required for producing the upper layers. This results in a more-efficient fabrication process that is more economical for production of the end-devices.

In one aspect, a multiple-layered memory device, comprises: a first memory device layer comprising: a first substrate including a first memory cell region, the first memory cell region including a first well positioned in an upper region thereof and a second well positioned in the first well, the first substrate comprising a semiconducting material doped with impurity of a first type, the first well comprising a semiconducting material doped with impurity of a second type opposite the first type, and the second well comprising a semiconducting material doped with impurity of the first type, a first active region of the first substrate being defined by the second well; and multiple first cell strings arranged on the first substrate in the first active region; and a second memory device layer on the first memory device layer comprising: a second substrate including a second memory cell region, the second substrate including only a single well in the second memory cell region, the single well of the second memory cell region comprising a semiconducting material doped with impurity of one of the first type and second type, the single well defining a second active region in the second memory cell region of the second substrate; and multiple second cell strings arranged on the second substrate in the second active region.

In one embodiment, the first type of impurity is n-type and the second type of impurity is p-type.

In another embodiment, the first type of impurity is p-type and the second type of impurity is n-type.

In another embodiment, the semiconducting material of the single well of the second substrate is doped with impurity of the first type.

In another embodiment, at least one of the first and second memory device layers further includes a peripheral region.

In another embodiment, the first memory device layer further includes a first peripheral region including first peripheral transistors.

In another embodiment, the second memory device layer further includes a second peripheral region including second peripheral transistors.

In another embodiment, the second peripheral region of the second memory device layer is physically isolated from the second cell strings of the second active region.

In another aspect, a method of forming a multiple-layered memory device comprises: providing a first memory device layer comprising: providing a first substrate including a first memory cell region, the first substrate comprising a semiconducting material doped with impurity of a first type; providing a first well in an upper region of the first memory cell region, the first well comprising a semiconducting material doped with impurity of a second type opposite the first type; and providing a second well in the first well, the second well comprising a semiconducting material doped with impurity of the first type, the second well of defining a first active region of the first substrate; and providing multiple first cell strings arranged on the first substrate in the first active region; and providing a second memory device layer on the first memory device layer comprising: providing a second substrate including a second memory cell region, the second substrate including only a single well in the second memory cell region, the single well of the second memory cell region comprising a semiconducting material doped with impurity of one of the first type and second type, the single well defining a second active region in the second memory cell region of the second substrate; and providing multiple second cell strings arranged on the second substrate in the second active region.

In one embodiment, the method further comprises providing an interlayer dielectric layer on the first memory device layer between the first memory device layer and the second memory device layer.

In another embodiment, the first type of impurity is n-type and the second type of impurity is p-type.

In another embodiment, the first type of impurity is p-type and the second type of impurity is n-type.

In another embodiment, the semiconducting material of the single well of the second substrate is doped with impurity of the first type.

In another embodiment, at least one of the first and second memory device layers further includes a peripheral region.

In another embodiment, providing the first memory device layer further comprises providing a first peripheral region including first peripheral transistors on the first substrate.

In another embodiment, the method further comprises removing a portion of the second substrate that lies on the first peripheral region of the first substrate.

In another embodiment, the second substrate of the second memory device layer is constructed and arranged so that when the second substrate is provided on the first substrate, no portion of the second substrate lies on the first peripheral region of the first substrate.

In another embodiment, providing the second memory device layer further comprises providing a second peripheral region including second peripheral transistors on the second substrate.

In another embodiment, the method further comprises physically isolating a portion of the second substrate of the second peripheral region of the second memory device layer from a portion of the second substrate of the second memory cell region, including the second cell strings.

In another aspect, a memory system comprises: a memory controller that generates command and address signals; and a memory module comprising a plurality of memory devices, the memory module receiving the command and address signals and in response storing and retrieving data to and from at least one of the memory devices. Each memory device is a multiple-layered memory device comprising: a plurality of addressable memory cells; a decoder that receives an address from an external source, and that generates a row signal and a column signal for accessing at least one of the addressable memory cells during programming and read operations; a first memory device layer comprising: a first substrate including a first memory cell region, the first memory cell region including a first well positioned in an upper region thereof and a second well positioned in the first well, the first substrate comprising a semiconducting material doped with impurity of a first type, the first well comprising a semiconducting material doped with impurity of a second type opposite the first type, and the second well comprising a semiconducting material doped with impurity of the first type, a first active region of the first substrate being defined by the second well; and multiple first cell strings of the addressable memory cells arranged on the first substrate in the first active region; and a second memory device layer on the first memory device layer comprising: a second substrate including a second memory cell region, the second substrate including only a single well in the second memory cell region, the single well of the second memory cell region comprising a semiconducting material doped with impurity of one of the first type and second type, the single well defining a second active region in the second memory cell region of the second substrate; and multiple second cell strings of the addressable cell strings arranged on the second substrate in the second active region.

In one embodiment, the first type of impurity is n-type and the second type of impurity is p-type.

In another embodiment, the first type of impurity is p-type and the second type of impurity is n-type.

In another embodiment, the semiconducting material of the single well of the second substrate is doped with impurity of the first type.

In another embodiment, at least one of the first and second memory device layers further includes a peripheral region.

In another embodiment, the first memory device layer further includes a first peripheral region including first peripheral transistors.

In another embodiment, the second memory device layer further includes a second peripheral region including second peripheral transistors.

In another embodiment, the second peripheral region of the second memory device layer is physically isolated from the second cell strings of the second active region.

BRIEF DESCRIPTION OF THE DRAWINGS

The foregoing and other objects, features and advantages of the embodiments of the invention will be apparent from the more particular description of embodiments of the invention, as illustrated in the accompanying drawings in which like reference characters refer to the same parts throughout the different views. The drawings are not necessarily to scale, emphasis instead being placed upon illustrating the principles of the invention. In the drawings:

FIGS. 2A-2F are cross-sectional diagrams, taken along section lines I-I' of FIG. 1A and 1B, of a process for forming a multiple-layered semiconductor device in accordance with an embodiment of the present invention.

DETAILED DESCRIPTION OF EMBODIMENTS

Embodiments of the present invention will now be described more fully hereinafter with reference to the accompanying drawings, in which preferred embodiments of the invention are shown. This invention may, however, be embodied in different forms and should not be construed as limited to the embodiments set forth herein. Like numbers refer to like elements throughout the specification.

It will be understood that, although the terms first, second, etc. are used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "on" or "connected" or "coupled" to another element, it can be directly on or above, or connected or coupled to, the other element or intervening elements can be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," etc.). When an element is referred to herein as being "over" another element, it can be over or under the other element, and either directly coupled to the other element, or intervening elements may be present, or the elements may be spaced apart by a void or gap.

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Figure 1A:
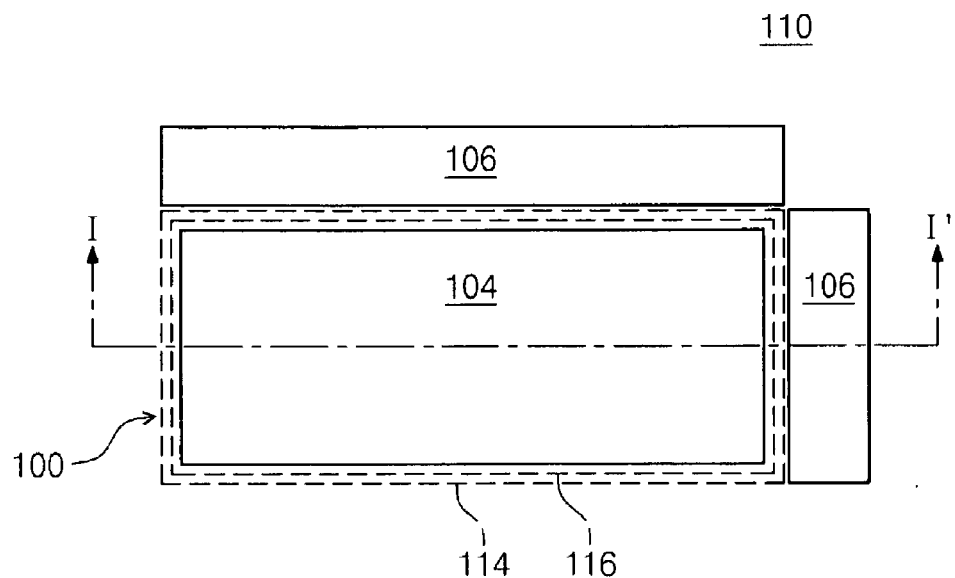
FIG. 1A is a plan view of a first semiconductor layer of a semiconductor device including a cell array region and a peripheral region, in accordance with an embodiment of the present invention.
Figure 1B:
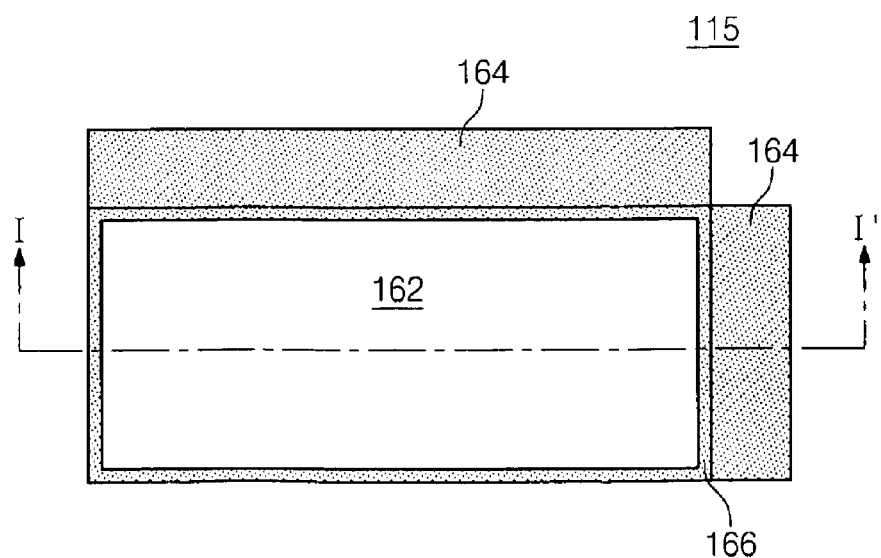
FIG. 1B is a plan view of a second semiconductor layer of a semiconductor device including a cell array region and a peripheral region, in accordance with an embodiment of the present invention.

FIG. 1A is a plan view of a first semiconductor layer of a semiconductor device including a cell array region and a peripheral region, in accordance with an embodiment of the present invention. FIG. 1B is a plan view of a second semiconductor layer of a semiconductor device including a cell array region and a peripheral region, in accordance with an embodiment of the present invention. FIGS. 2A-2F are cross-sectional diagrams, taken along section lines I-I' of FIGS. 1A and 1B, of a process for forming a multiple-layered semiconductor device in accordance with an embodiment of the present invention.

Referring to FIG. 2A, a first layer 110 of a semiconductor device includes a memory cell region 104 and a peripheral region 106 formed in a substrate 100. The memory cell region 104 includes a plurality of memory cells, in this case arranged in cell strings 120. Each cell string 120 includes a plurality of memory cell transistors 126, a ground selection transistor 122 and a string selection transistor 124 arranged in a horizontal configuration. First impurity-doped regions 132 are provided in the substrate 100 between neighboring transistors 122, 124, 126 and second and third impurity-doped regions 130, 134 are provided in the substrate 100 between neighboring cell strings 120. The peripheral region 106 includes a plurality of peripheral transistors 140. Fourth impurity-doped regions 142 are positioned at sidewalls of the peripheral transistors 140. An insulative capping layer 151 is provided over the resulting structure in the memory cell region 104 and in the peripheral region 106. A first interlayer dielectric layer 150 is provided over the capping layer 151.

In the memory cell region 104, the cell strings 120 are positioned on the substrate 100 in a pocket well 116 that surrounds the memory cells. The pocket well 116 is in turn positioned in a deep well 114. In an example where the substrate 100 is a p-type substrate, the deep well 114 can be n-type, and the pocket well can be p-type. In the peripheral circuit region 106, the peripheral transistors 140 are positioned on the substrate 100 in a peripheral well 118, which can be n-type or p-type. Combining the pocket well 116 and deep well 114 in the memory cell region 104 and the peripheral well 118 in the peripheral region, such a well configuration 114, 116, 118 is referred to as a "triple well" configuration. The wells 114, 116, 118 are typically formed during preparation of the substrate 100, prior to fabrication of the various transistors in the memory cell region 104 and peripheral region; however embodiments of the invention are not limited thereto, and well formation can take place at another time during device fabrication.

Referring to FIG. 1A, it can be seen that in the memory cell region 104 of the first layer 110, the memory cell region 104 is located on the substrate 100 so as to be surrounded by the pocket well 116, which, in turn is surrounded by the deep well 114. In another embodiment, not shown in the drawings, a plurality of pocket well regions 116 corresponding to different cell strings 120 of the memory cell region 104 can be formed in the memory cell region 104, and the plurality of pocket well regions 116 can in turn be surrounded by the deep well 114.

Figure 2B:
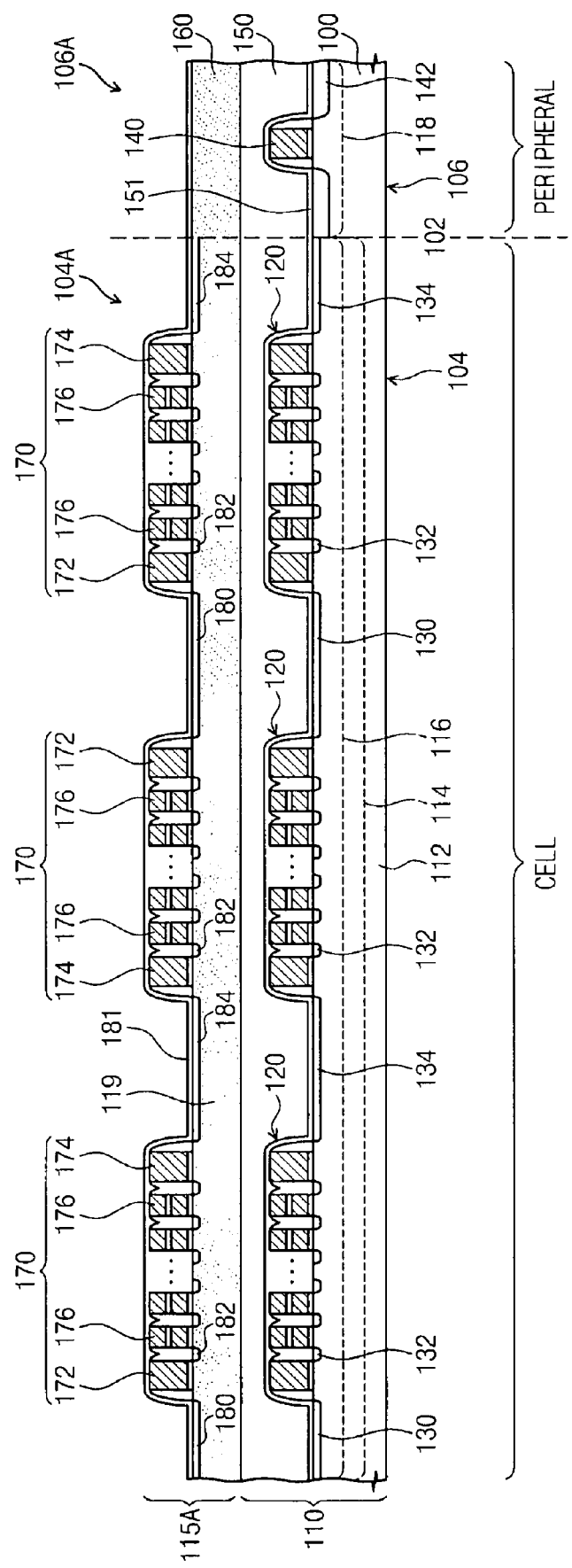

Referring to FIG. 2B, a preliminary second layer 115A of a semiconductor device is prepared to include a memory cell region 104A and a peripheral region 106A formed in a substrate 160. The memory cell region 104A includes a plurality of memory cells, in this case arranged in cell strings 170. Like the first layer 110, each cell string 170 of the preliminary second layer 115A includes a plurality of memory cell transistors 176, a ground selection transistor 172 and a string selection transistor 174 arranged in a horizontal configuration. First impurity-doped regions 182 are provided in the substrate 160 between neighboring transistors 172, 174, 176 and second and third impurity-doped regions 180, 184 are provided in the substrate 160 between neighboring cell strings 170. The peripheral region 106A, in this embodiment, does not include any peripheral transistors, or alternatively can include dummy transistors that are dormant or otherwise unused or unnecessary to device operation. An insulative second capping layer 181 is provided over the resulting structure in the memory cell region 104A and in the peripheral region 106A. The substrate 160 of the preliminary second layer 115A is isolated from elements of the underlying first layer 110 by the first interlayer dielectric layer 150. In the embodiment shown, the memory cell region 104A of the preliminary second layer 115A is generally aligned with the memory cell region 104 of the first layer 110. The peripheral region 106A of the preliminary second layer 115A at this time covers the peripheral region 106 of the first layer.

In the memory cell region 104A of the preliminary second layer 115A, the cell strings 170 are positioned on the substrate 160 in a single well 119 that defines an active region of the preliminary second layer 115A. The substrate 160 of the preliminary second layer 115A can be formed, for example, of an SOI-type substrate, formed, for example, using selective epitaxial growth (SEG) or laser-induced epitaxial growth (LEG), or otherwise can be applied using a wafer-bonding process. In an example where the material of the substrate 160 is n-type, the single well 119 can be p-type. The SOI-type substrate can include, for example, the substrate 160, formed of silicon, and positioned on the underlying insulating layer 150. In an example embodiment for forming the single well 119, the single well 119 can be formed by applying a dopant to an upper region of the substrate 160 surface, and the dopant is then diffused into the body of the substrate 160 using a high-temperature application. As a result, the highest concentration of impurities is at a bottom portion of the single well 119. In this embodiment, the single well 119 can optionally also be provided in the peripheral region 106A of the preliminary second layer 115A, in order to simplify processing of the substrate 160 of the preliminary second layer 115A during its preparation.

Figure 2C:
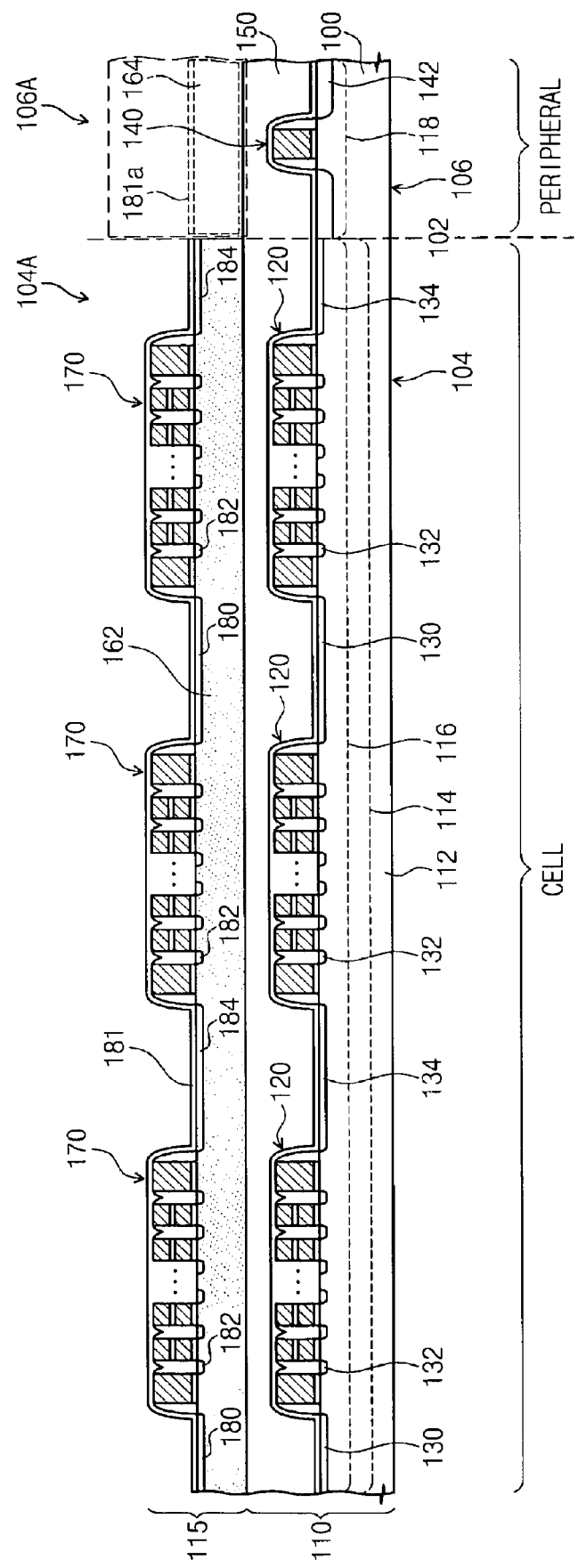

Referring to FIG. 2C, the peripheral region 106A of the substrate 160 of the second layer 115A is removed. Also removed is the portion 181A of the second capping layer 181 in the peripheral region 106A. In this manner, the resulting second layer 115 includes only the memory cell region 104A, and does not include the removed portion 164 of the substrate 160 that lies in the peripheral region 106A of the device. In various embodiments, the portion 181A of the second capping layer 181 and the portion 164 of the substrate 160 can be removed using application of a hard mask layer, followed by an etch of the portions to be removed.

Referring to FIG. 1B, it can be seen that the second layer 115 of the semiconductor device includes the memory cell region 162, and does not include removed portions 164 of the peripheral region 106A, and removed portions 166 of other neighboring regions surrounding the memory cell region 162.

Figure 2D:
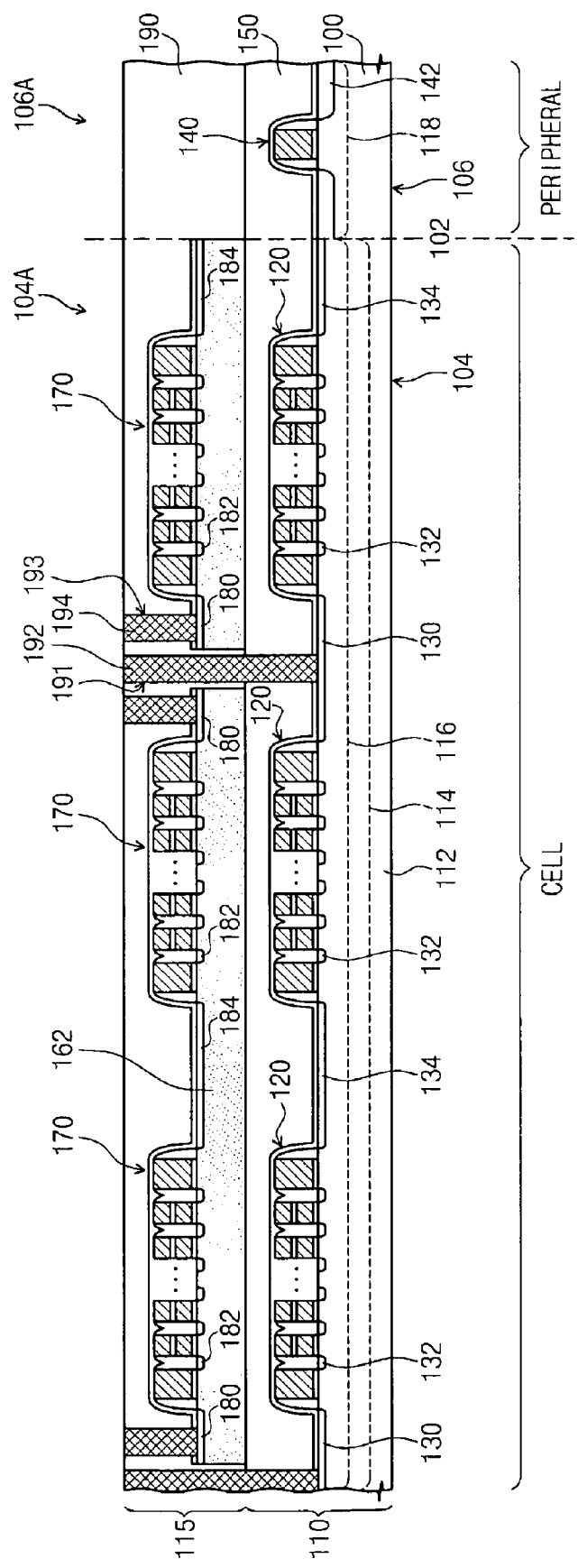

Referring to FIG. 2D, contacts for common source lines (CSL) are formed. A second interlayer dielectric layer 190 is provided over the second capping layer 181. First contact holes 191 are formed in the second and first layers 115, 110 of the resulting structure to contact the underlying source regions 130 of the cell strings 120 of the first layer 110. The first contact holes 191 are formed so as to be isolated from other elements of the first and second layers 110, 115. Similarly, second contact holes 193 are formed in the second layer 115 of the resulting structure to contact the underlying source regions 180 of the cell strings 120 of the second layer 115. The second contact holes 193 are formed so as to be isolated from other elements of the second layer 115. The first and second contact holes 191, 193 are then filled with a conductive material to form CSL contacts 192, 194, that provide electrical contact with the source regions 130, 180.

Figure 2E:
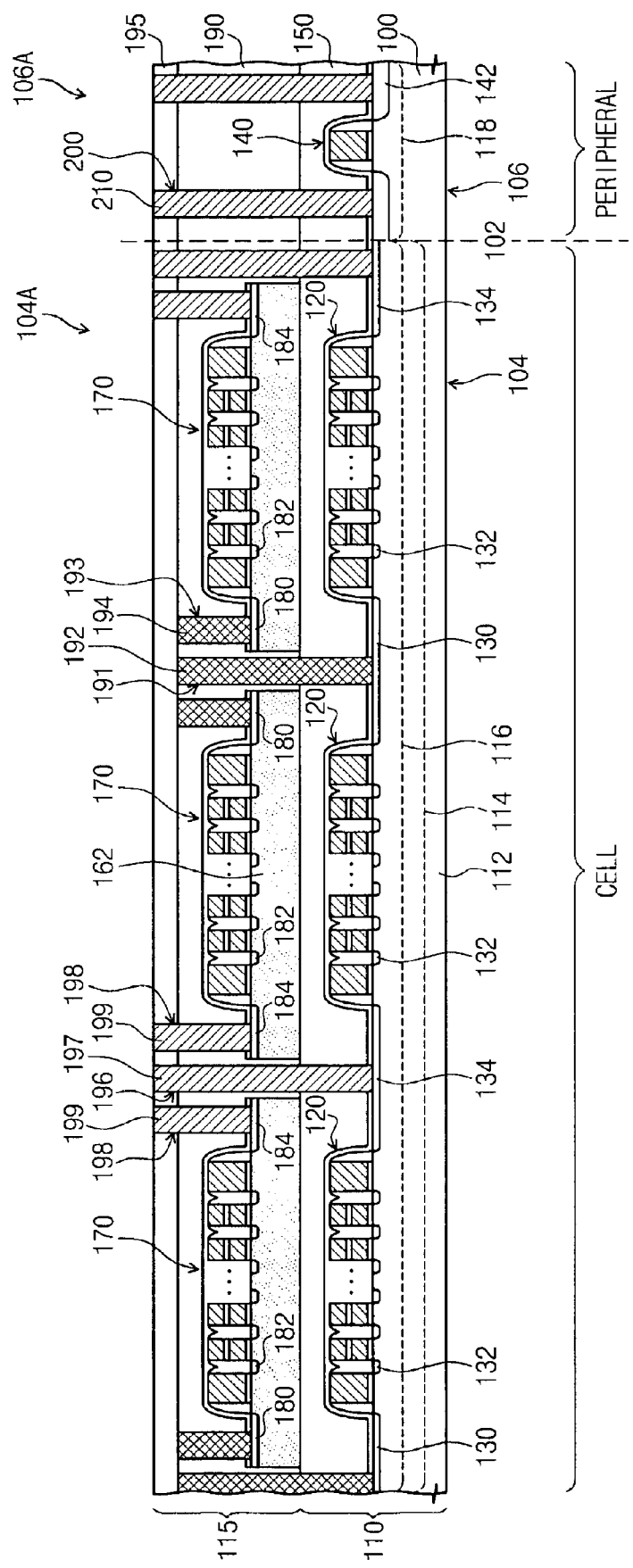

Referring to FIG. 2E, contacts for bit lines are formed. A third interlayer dielectric layer 195 is provided over the resulting structure. First bit line holes 196 are formed in the second and first layers 115, 110 of the resulting structure to contact the underlying common drain regions 134 of the cell strings 120 of the first layer 110. The first bit line holes 196 are formed so as to be isolated from other elements of the first and second layers 110, 115. Similarly, second bit line holes 198 are formed in the second layer 115 of the resulting structure to contact the underlying common drain regions 184 of the cell strings 120 of the second layer 115. The second bit line holes 198 are formed so as to be isolated from other elements of the second layer 115. The first and second bit line holes 196, 198 are then filled with a conductive material for providing bit line plugs 197, 199 that provide electrical contact with the common drain regions 134, 184. At this time, peripheral transistor contact holes 200 can also be formed through the third, second and first interlayer dielectric layers 195, 190, 150 in the peripheral region of the device, and plugs applied to form peripheral contacts 210 that contact the source, drain and/or gate elements 140, 142 of the peripheral transistors of the first layer 110.

Figure 2F:
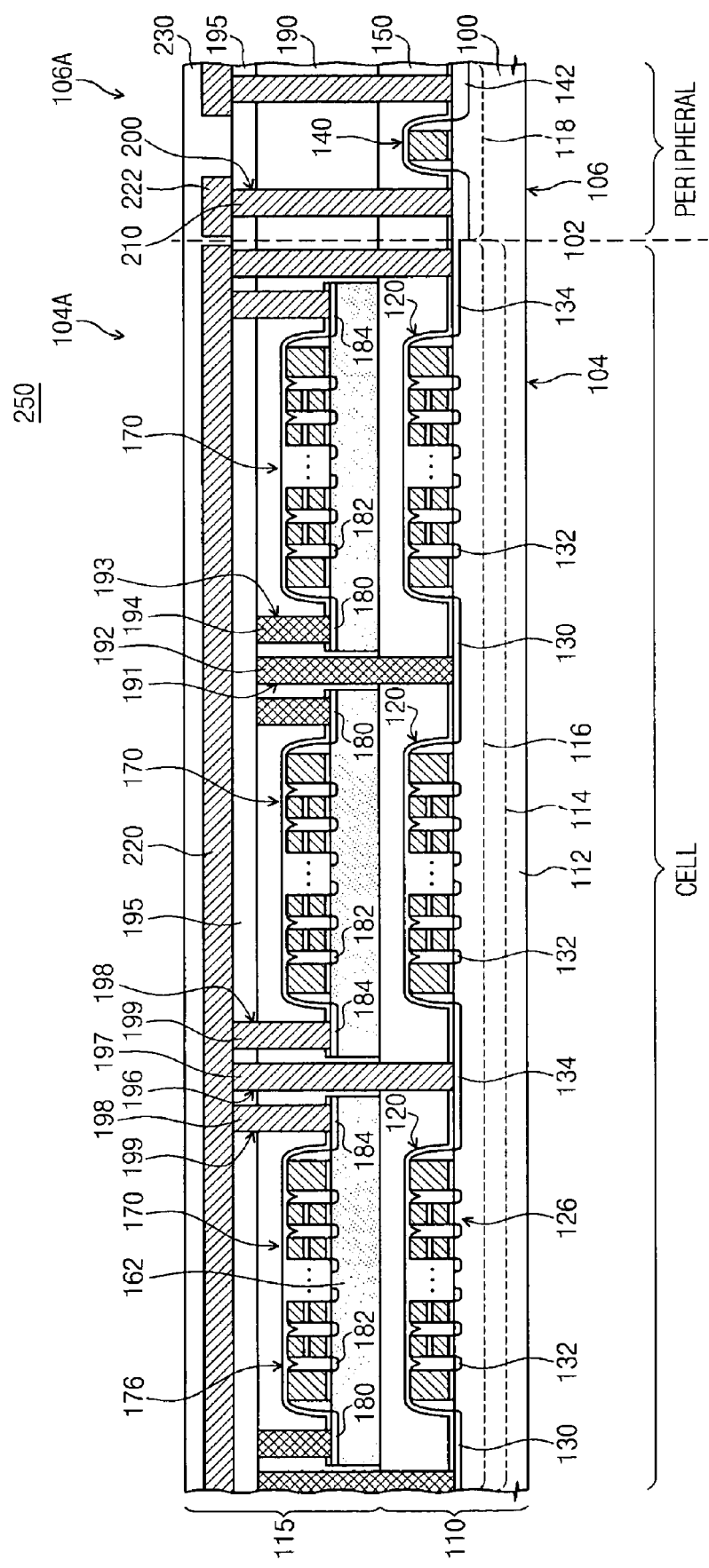

Referring to FIG. 2F, bit lines are formed. Bit lines 220 are formed and patterned on the resulting structure to connect the common drain regions 134, 184 of the cell strings 120, 170 of the first and/or second layers 110, 115 of the device. At the same time, other interconnect vias 222 can be formed in the peripheral region 106A and in the memory cell region 104A. A fourth interlayer dielectric layer 230 is optionally provided over the resulting structure to insulate the bit lines 220 and interconnect vias 222.

In the resulting multiple-layered semiconductor device, the substrate 160 of the second layer 115 is physically and electrically isolated from the peripheral transistors 140 of the first layer 110 by virtue of the fact that they lie on different substrates. As a result, the operation of the cell strings 170 of the second layer 115 is isolated from the peripheral transistors 140 of the first layer 110. Thus, during a programming or erase operation of the memory cells 176 of the second layer 115, requiring a high voltage to be applied to the single well 119 in the substrate 160 of the second layer 115, the high voltage will not interfere with the operation of the peripheral transistors 140 of the first layer 110, since they are physically and electrically isolated from each other. Therefore, a multiple well configuration is not required in the second layer 115. As a result, the substrate 160 of the second layer 115 can be prepared to have a thinner profile, and with fewer processing steps, resulting in devices with higher density, greater reliability, and reduced fabrication costs.

At the same time, since the memory cells 126 of the first layer 110 are formed in the multiple-well structure of the memory cell region 104A of the first substrate 100, including the pocket well 116 and deep well 114, and since the peripheral transistors 140 of the first layer are formed in the peripheral well 118 of the peripheral region 106A of the first substrate 100, they too are isolated from each other, as a result of the triple-well configuration of the first layer 110. Therefore, during a programming or erase operation of the memory cells 126 of the first layer 110, requiring a high voltage to be applied to the pocket well 116, the high voltage will not interfere with the operation of the peripheral transistors 140 in the peripheral region 106A of the first layer 110, since they are isolated from each other.

Figure 3:
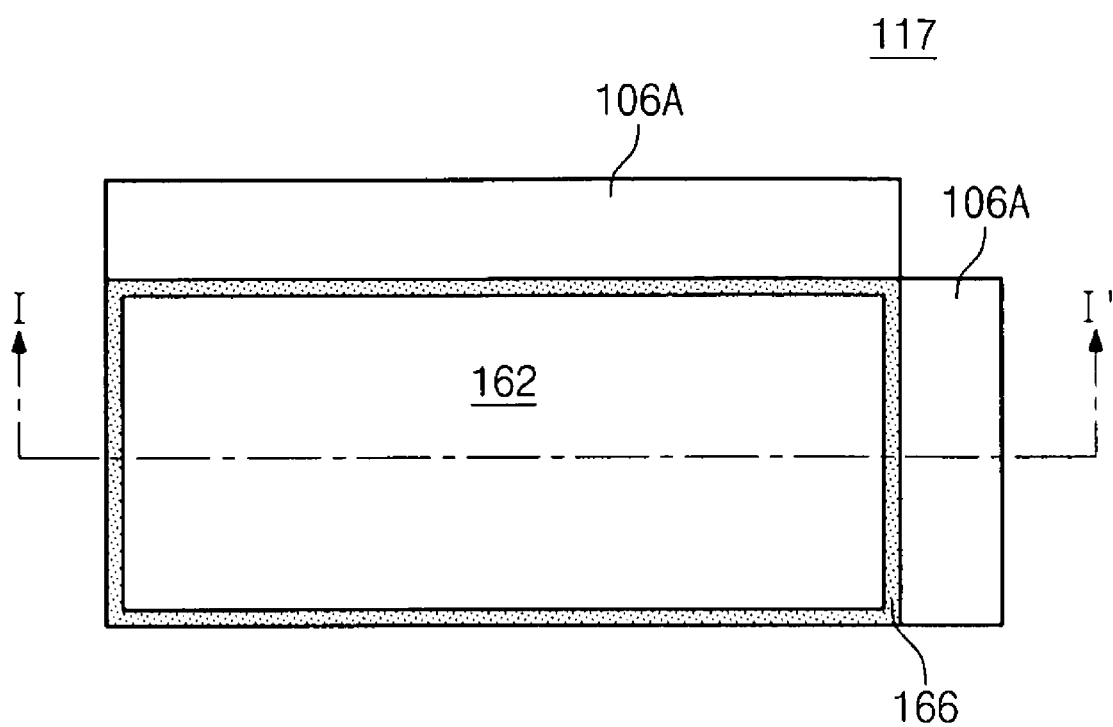
FIG. 3 is a plan view of a second semiconductor layer of a semiconductor device including a cell array region and a peripheral region, in accordance with another embodiment of the present invention.
Figure 4A:
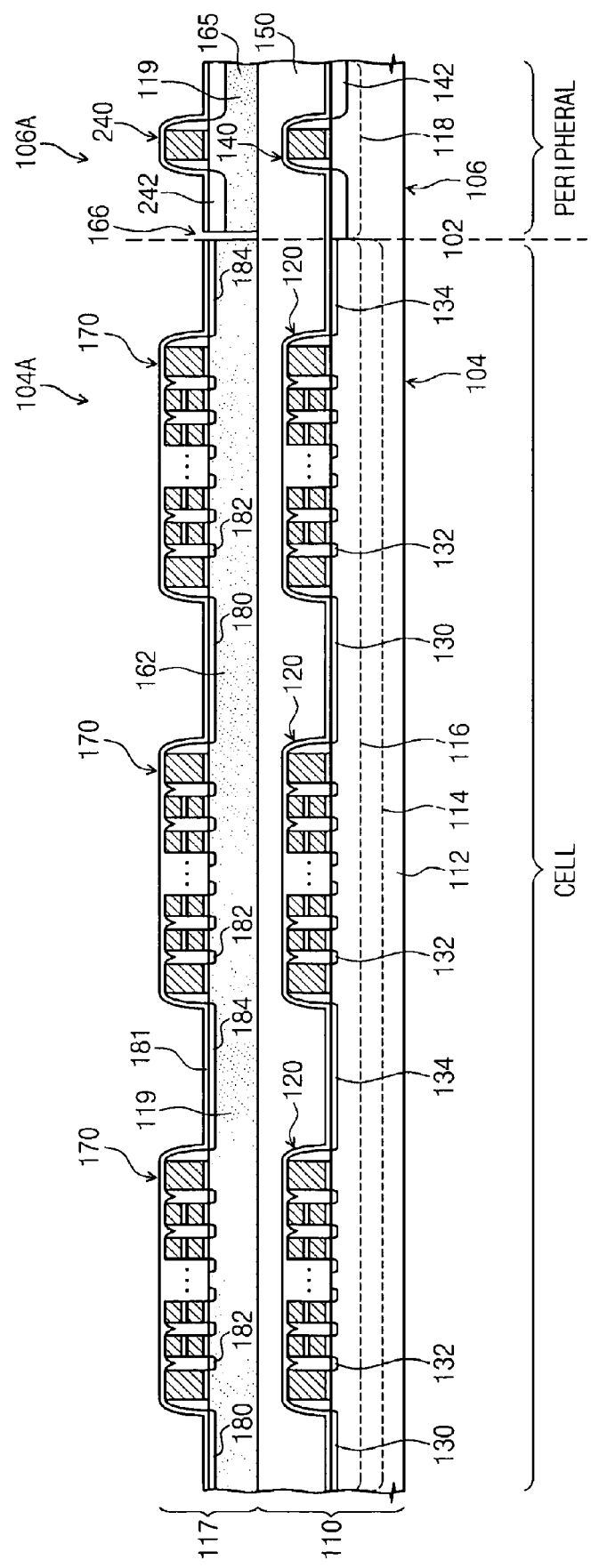
FIGS. 4A and 4B are cross-sectional diagrams, taken along section lines I-I' of FIGS. 1A and 3 respectively, of a process for forming a multiple-layered semiconductor device in accordance with another embodiment of the present invention.
Figure 4B:
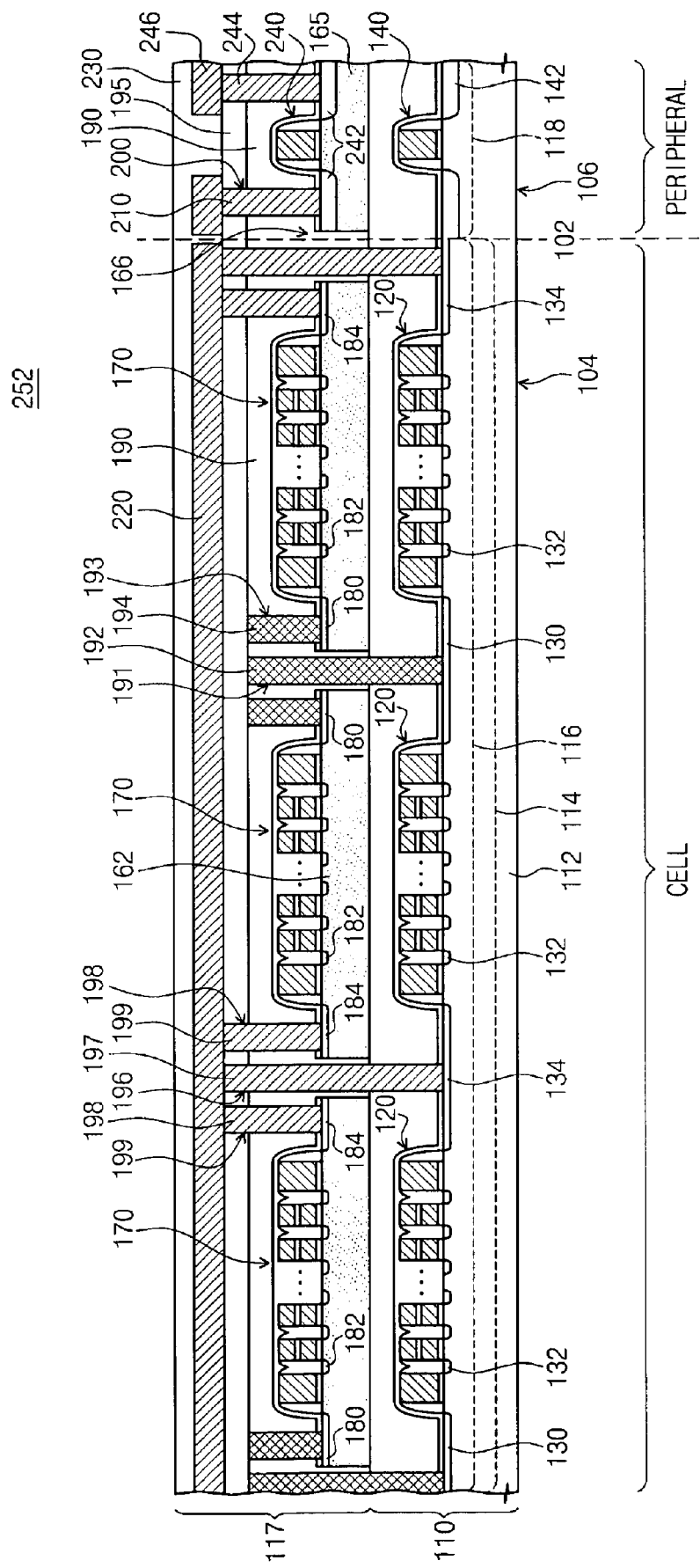

FIG. 3 is a plan view of a second semiconductor layer of a semiconductor device including a cell array region and a peripheral region, in accordance with another embodiment of the present invention. FIGS. 4A and 4B are cross-sectional diagrams, taken along section lines I-I' of FIGS. 1A and 3 respectively, of a process for forming a multiple-layered semiconductor device in accordance with another embodiment of the present invention.

Referring to FIG. 4A, a first layer of a semiconductor device is prepared, for example in accordance with the first layer 110 described above in connection with FIG. 2A.

A second layer 117 of a semiconductor device is prepared to include a memory cell region 104A and a peripheral region 106A formed in a substrate 165. The memory cell region 104A includes a plurality of memory cells, in this case arranged in cell strings 170. Like the first layer 110, each cell string 170 of the second layer 117 includes a plurality of memory cell transistors 176, a ground selection transistor 172 and a string selection transistor 174 arranged in a horizontal configuration, as shown in FIG. 2B above. First impurity-doped regions 182 are provided in the substrate 165 between neighboring transistors and second and third impurity-doped regions 180, 184 are provided in the substrate 165 between neighboring cell strings 170. The peripheral region 106A, in this embodiment, includes peripheral transistors 240, and source/drain regions 242 formed at sides of the gates of the peripheral transistors 240. Alternatively, the peripheral region 106A can include dummy transistors that are dormant or otherwise unused or unnecessary to device operation, or can be void of peripheral or dummy transistors. An insulative second capping layer 181 is provided over the resulting structure in the memory cell region 104A and in the peripheral region 106A. As in the above embodiment of FIGS. 1A-1B and 2A-2F, the substrate 165 of the second layer 117 is isolated from elements of the underlying first layer 110 by the first interlayer dielectric layer 150. Also, as above, in the embodiment shown, the memory cell region 104A of the second layer 117 is generally aligned with the memory cell region 104 of the first layer 110. The peripheral region 106A of the second layer 117 covers the peripheral region 106 of the first layer 110.

In the memory cell region 104A of the second layer 117, the cell strings 170 are positioned on the substrate 165 in a single well 119 that defines an active region of the second layer 117. The substrate 165 of the second layer 117 can be formed, for example, of an SOI-type substrate, formed, for example, using selective epitaxial growth (SEG) or laser-induced epitaxial growth (LEG), or otherwise can be applied using a wafer-bonding process. In an example where the semiconductor material of the substrate 165 is n-type, the single well 119 can be p-type. In an example embodiment for forming the single well 119, the single well 119 can be formed by applying a dopant to an upper region of the substrate 165 surface, and the dopant is then diffused into the body of the substrate 165 using a high-temperature application. As a result, the highest concentration of impurities is at a bottom portion of the single well 119. In this embodiment, the single well 119 can optionally also be provided in the peripheral region 106A of the second layer 117, in order to simplify processing of the substrate 160 of the second layer 117 during its preparation.

Continuing to refer to FIG. 4A, in this embodiment, a portion 166 of the substrate 165 of the second layer 117 is removed so that the peripheral region 106A of the substrate 165 of the second layer 117 at a position where the peripheral region 106A borders the memory cell region 104A, is physically isolated, or spaced apart from, the memory cell region 104A of the substrate 165 of the second layer 117. Such removal of the portion 166 can be accomplished, for example, by etching, such as dry etching, or laser ablation, Referring to FIG. 3, it can be seen that the second layer 117 of the semiconductor device includes the memory cell region 162 and the peripheral region 106A. It can also be seen that portions 166 between the memory cell region 162 and the peripheral region 106A, and portions bordering the memory cell region 162 are removed to provide the physical isolation.

Referring to FIG. 4B, the resulting semiconductor device is processed in accordance with the steps described above in connection with FIGS. 2D-2F, for example to provide the common source line and bit line connectivity, as well as connectivity to the peripheral transistors. However, in the present embodiment shown in FIG. 4B, the peripheral region 106A of the second layer 117 remains, and is not removed. Therefore, the peripheral transistors 240 of the second layer 117 are utilized in the resulting semiconductor device, instead of, or in addition to, the peripheral transistors 140 of the first layer 110. In this embodiment, the applied second interlayer dielectric layer 190 operates to fill the void in the second substrate 165 between the memory cell region 104A and the peripheral region 106A, thereby providing electrical isolation between the two regions 104A, 106A of the second substrate 165.

As a result of the isolation between the first and second layers 110, 117, the substrate 165 of the memory cell region 104A of the second layer 117 is isolated from the peripheral transistors 140 of the first layer 110 by virtue of the fact that they lie on different substrates. In addition, in this embodiment, the substrate 165 of the memory cell region 104A of the second layer 117 is isolated from the substrate 165 of the peripheral transistors 240 of the second layer 117 by virtue of the fact that they are physically isolated from each other due to the removed portion 166.

Accordingly, the operation of the cell strings 170 of the second layer 117 is physically and electrically isolated from the peripheral transistors 140 of the first layer 110. Also, in this embodiment, the operation of the cell strings 170 of the second layer 117 is physically and electrically isolated from the peripheral transistors 240 of the second layer 110. Thus, during a programming or erase operation of the memory cells 176 of the second layer 117, requiring a high voltage to be applied to the single well 119 in the substrate 165 of the second layer 117, the high voltage will not interfere with the operation of the peripheral transistors 140 of the first layer 110, since they are isolated from each other. Nor will the application of the high voltage interfere with the operation of the peripheral transistors 240 of the second layer 117, since they are isolated from each other. Therefore, a multiple well configuration is not required in the second layer 117. As a result, the substrate of the second layer 117 can be prepared to have a thinner profile, and with fewer processing steps, resulting in devices with higher density, greater reliability, and reduced fabrication costs.

At the same time, since the memory cells 126 of the first layer 110 are formed in the multiple-well structure of the memory cell region 104A of the first substrate 100, including the pocket well 116 and deep well 114, and since the peripheral transistors 140 of the first layer 110 are formed in the peripheral well 118 of the peripheral region 106A of the first substrate 100, they too are isolated from each other, as a result of the triple-well configuration of the first layer 110. Therefore, during a programming or erase operation of the memory cells 126 of the first layer 110, requiring a high voltage to be applied to the pocket well 116, the high voltage will not interfere with the operation of the peripheral transistors 140 in the peripheral region 106A of the first layer 110, since they are isolated from each other. Nor will the application of the high voltage to the memory cells 126 of the first layer 110 interfere with the operation of the peripheral transistors 240 of the second layer 117, since they are isolated from each other.

Figure 5A:
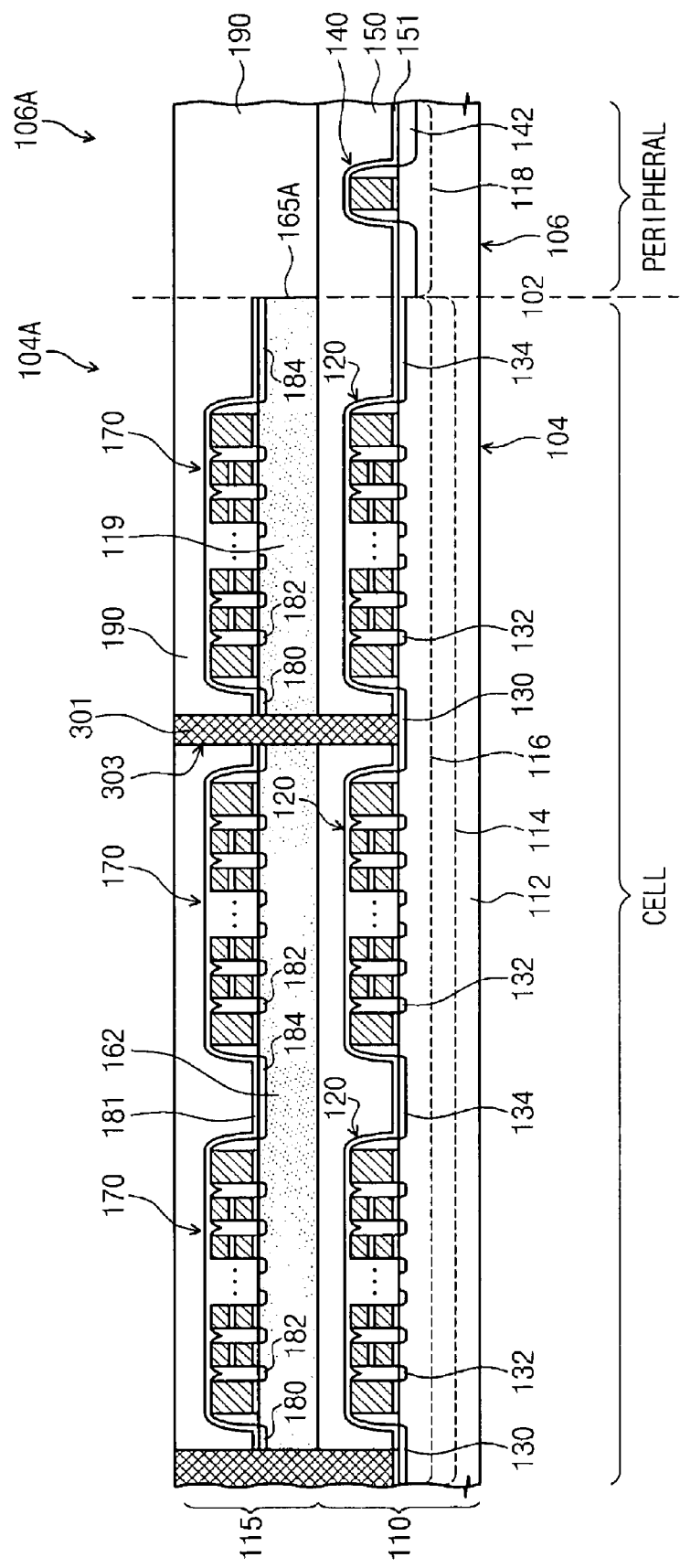
FIGS. 5A-5C are cross-sectional diagrams of a process for forming a semiconductor device in accordance with another embodiment of the present invention.
Figure 5B:
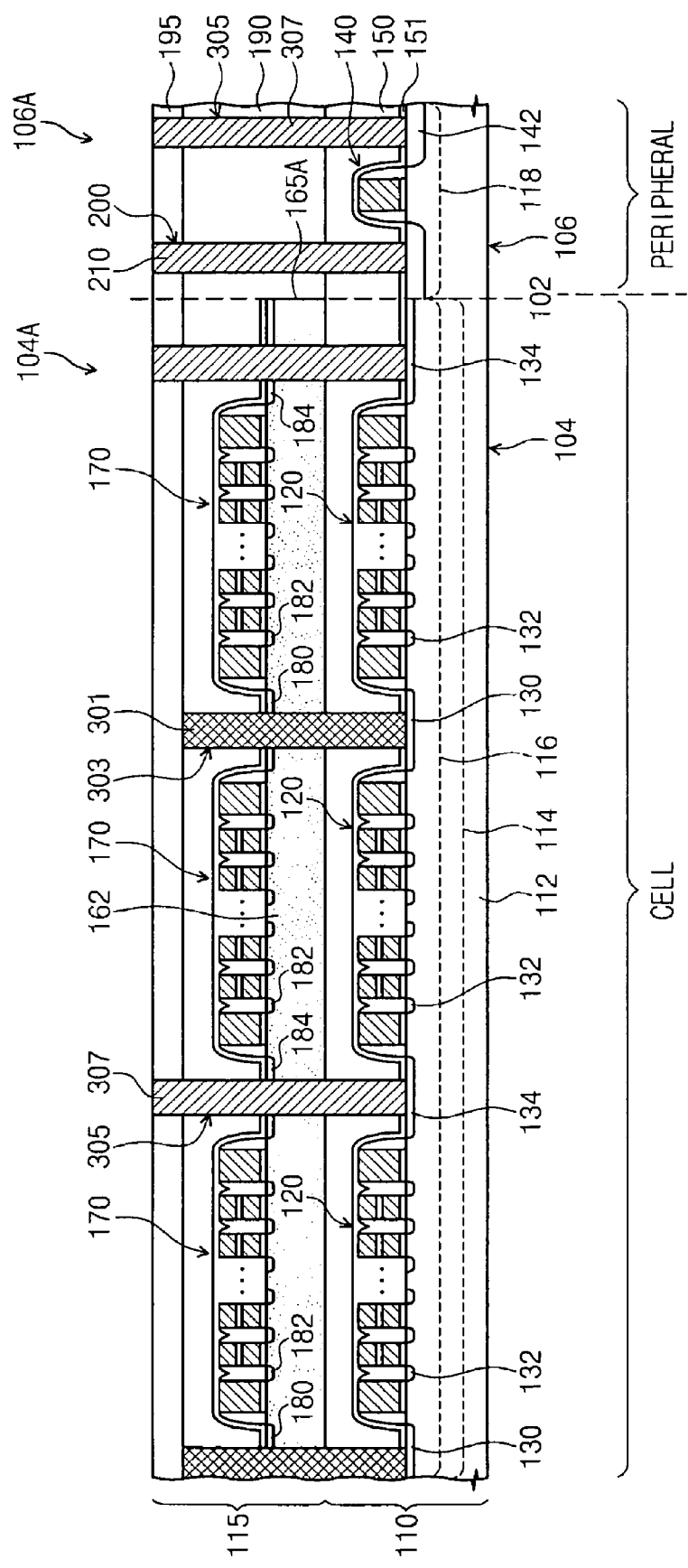
Figure 5C:
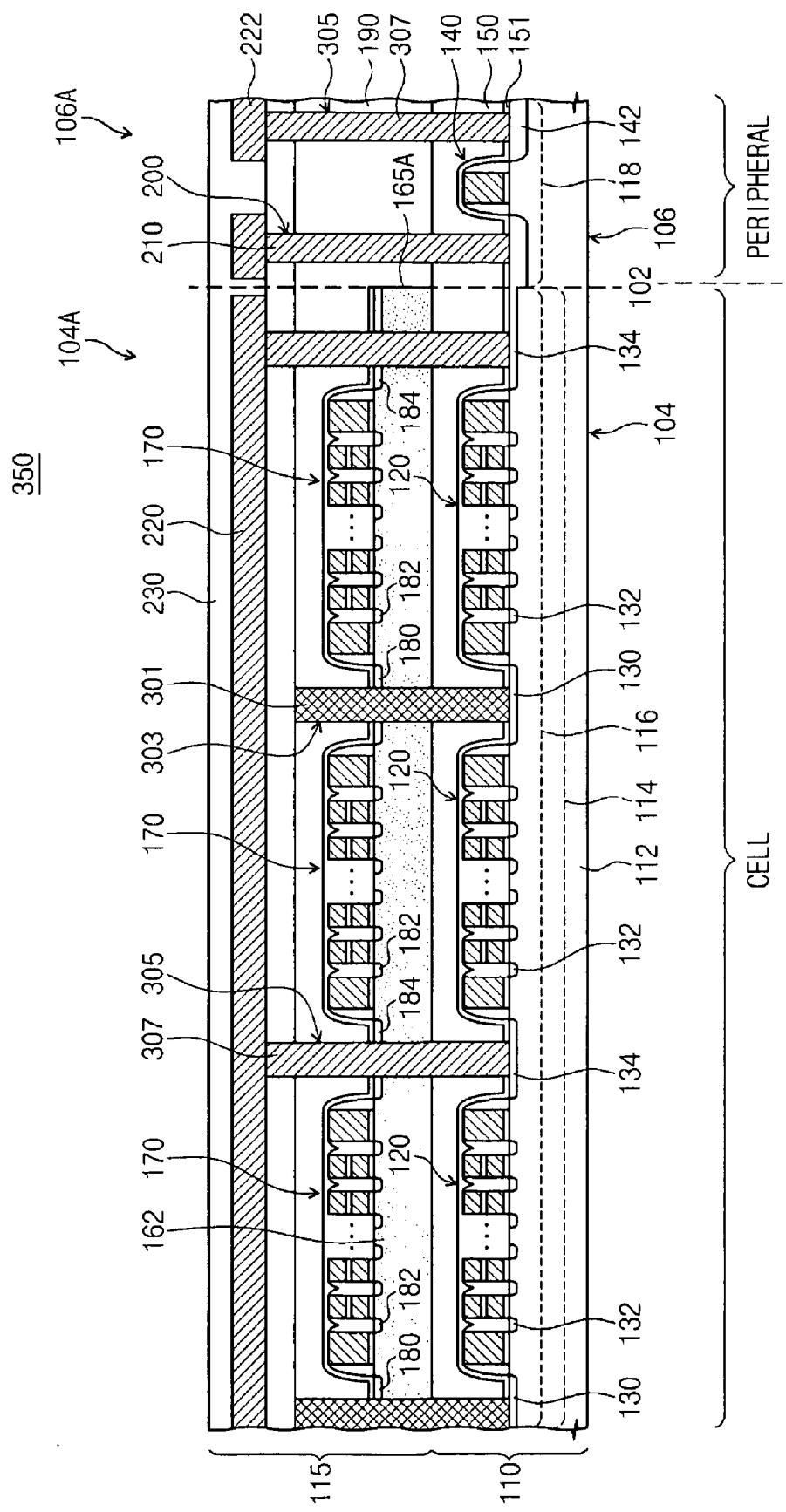

FIGS. 5A-5C are cross-sectional diagrams of a process for forming a semiconductor device in accordance with another embodiment of the present invention.

Referring to FIG. 5A, a first layer of a semiconductor device is prepared, for example in accordance with the first layer 110 described above in connection with FIG. 2A.

In the present embodiment of FIGS. 5A-5C, a second layer 115 of a semiconductor device is prepared to include a memory cell region 104A formed in a substrate 165A. The substrate 165A of the second layer 115 does not include a peripheral region 106A in this embodiment. In other words, at the time when the second layer 115 is aligned and positioned on the first layer 110, no peripheral region 106A of the substrate 165A of the second layer 115 is present in this embodiment. The memory cell region 104A includes a plurality of memory cells, in this case arranged in cell strings 170. Like the first layer 110, each cell string 170 of the second layer 115 includes a plurality of memory cell transistors 176, a ground selection transistor 172 and a string selection transistor 174 arranged in a horizontal configuration, as shown in FIG. 2B above. First impurity-doped regions 182 are provided in the substrate 165A between neighboring transistors and second and third impurity-doped regions 180, 184 are provided in the substrate 165A between neighboring cell strings 170. An insulative second capping layer 181 is provided over the resulting structure in the memory cell region 104A. The peripheral region 106A is not present in this embodiment, and therefore includes no substrate and no transistors. The peripheral region 106 of the first layer 110 is covered by the application of the second interlayer dielectric layer 190 that covers the memory cell region 104A of the second layer 115.

As in the above embodiments, the substrate 165A of the second layer 115 is isolated from elements of the underlying first layer 110 by the first interlayer dielectric layer 150. Also, as above, in the embodiment shown, the memory cell region 104A of the second layer 115 is generally aligned with the memory cell region 104 of the first layer 110.

In the memory cell region 104A of the second layer 115, the cell strings 170 are positioned on the substrate 165A in a single well 119 that defines an active region of the second layer 115. The substrate 165A of the second layer 115 can be formed, for example, of an SOI-type substrate, formed, for example, using selective epitaxial growth (SEG) or laser-induced epitaxial growth (LEG), or otherwise can be applied using a wafer-bonding process. In an example where the material of the substrate 165A is n-type, the single well 119 can be p-type. In an example embodiment for forming the single well 119, the single well 119 can be formed by applying a dopant to an upper region of the substrate 165A surface, and the dopant is then diffused into the body of the substrate 165A using a high-temperature application. As a result, the highest concentration of impurities is at a bottom portion of the single well 119.

Continuing to refer to FIG. 5A, contacts for common source lines (CSL) are next formed in a manner similar to that described above in connection with FIG. 2D. Contact holes 303 are formed in the second and first layers 115, 110 of the resulting structure to contact the underlying source regions 130, 180 of the cell strings 120, 170 of the first layer 110 and second layer 115 respectively. The contact holes 303 are formed so as to be isolated from other elements of the first and second layers 110, 115. The contact holes 303 are then filled with a conductive material to provide common source line contacts 301 that provide electrical contact with the source regions 130, 180.

Referring to FIG. 5B, contacts for bit lines are formed in a manner similar to that described above in connection with FIG. 2E. A third interlayer dielectric layer 195 is provided over the resulting structure. Bit line holes 305 are formed in the second and first layers 115, 110 of the resulting structure to contact the underlying common drain regions 134, 184 of the cell strings 120, 170 of the first layer 110 and second layer 115 respectively. The bit line holes 305 are formed so as to be isolated from other elements of the first and second layers 110, 115. The bit line holes 305 are then filled with a conductive material for providing bit line plugs 307 that provide electrical contact with the common drain regions 134, 184. At this time, peripheral transistor contact holes 200 can also be formed through the third, second and first interlayer dielectric layers 195, 190, 150 in the peripheral region of the device, and plugs applied to form peripheral contacts 210 that contact the source, drain and/or gate elements 140, 142 of the peripheral transistors of the first layer 110.

Referring to FIG. 5C, bit lines are formed in a manner similar to that described above in connection with FIG. 2F. Bit lines 220 are formed and patterned on the resulting structure to connect the common drain regions 134, 184 of the cell strings 120, 170 of the first and/or second layers 110, 115 of the device. At the same time, other types of interconnect vias 222 can be formed in the peripheral region 106A and in the memory cell region 104A. A fourth interlayer dielectric layer 230 is optionally provided over the resulting structure to insulate the bit lines 220 and interconnect vias 222.

In the resulting multiple-layered semiconductor device, the substrate 165A of the second layer 115 is physically and electrically isolated from the peripheral transistors 140 of the first layer 110 by virtue of the fact that they lie on different substrates. As a result, the operation of the cell strings 170 of the second layer 115 is physically and electrically isolated from the peripheral transistors 140 of the first layer 110. Thus, during a programming or erase operation of the memory cells 176 of the second layer 115, requiring a high voltage to be applied to the single well 119 in the substrate 160 of the second layer 115, the high voltage will not interfere with the operation of the peripheral transistors 140 of the first layer 110, since they are physically and electrically isolated from each other. Therefore, a multiple well configuration is not required in the second layer 115. As a result, the substrate 165A of the second layer 115 can be prepared to have a thinner profile, and with fewer processing steps, resulting in devices with higher-density, greater reliability, and reduced fabrication costs.

At the same time, since the memory cells 126 of the first layer 110 are formed in the multiple-well structure of the memory cell region 104A of the first substrate 100, including the pocket well 116 and deep well 114, and since the peripheral transistors 140 of the first layer are formed in the peripheral well 118 of the peripheral region 106A of the first substrate 100, they too are isolated from each other, as a result of the triple-well configuration of the first layer 110. Therefore, during a programming or erase operation of the memory cells 126 of the first layer 110, requiring a high voltage to be applied to the pocket well 116, the high voltage will not interfere with the operation of the peripheral transistors 140 in the peripheral region 106A of the first layer 110, since they are isolated from each other. In the embodiment of FIGS. 5A-5C, it is not necessary to form the peripheral region of the second layer 115, and only the memory cell region 104A of the second layer 115 is applied to the first layer 110. This reduces the number of processing steps required for fabricating the device, reducing manufacturing costs.

Figure 6:
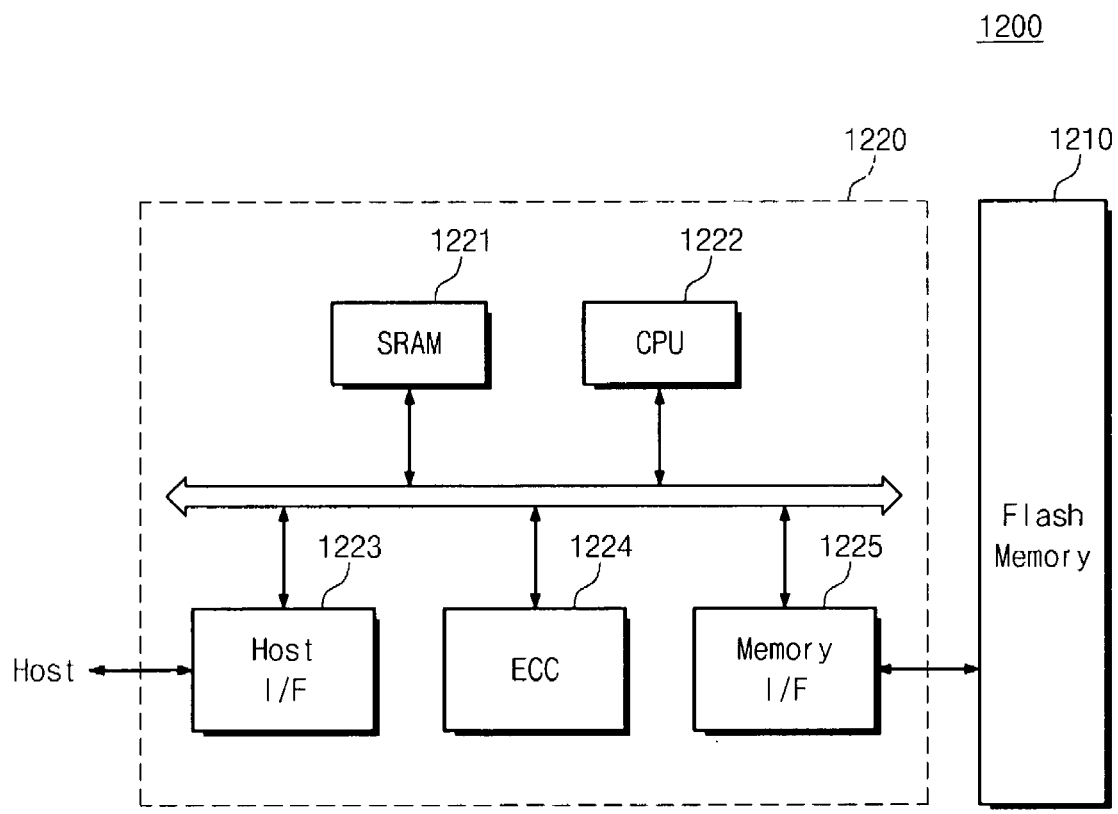
FIG. 6 is a block diagram of a memory card that includes a semiconductor device in accordance with the embodiments of the present invention.

In the present example, since the common source line contact plugs 301 make direct contact with the source regions 180 of the second layer 115 and inner regions of the second substrate 165A, and since the bit line plugs 307 make direct contact with the common drain regions 184 and inner regions of the second substrate 165A, they are formed, for example, of n+ type doped polysilicon, assuming a p+ type second substrate 165A. On the other hand, the contact plugs 192, 194, 197, 198 of the embodiments of FIG. 2A-2F can be formed of metal, for example tungsten, since the contact plugs 192, 194, 197, 199 are physically isolated from the second substrate 165A or do not otherwise pass through the second substrate 165A FIG. 6 is a block diagram of a memory card that includes a semiconductor device in accordance with the embodiments of the present invention. The memory card 1200 includes a memory controller 1220 that generates command and address signals C/A and a memory module 1210 for example, flash memory 1210 that includes one or a plurality of flash memory devices. The memory controller 1220 includes a host interface 1223 that transmits and receives command and address signals to and from a host, a controller 1224, and a memory interface 1225 that in turn transmits and receives the command and address signals to and from the memory module 1210. The host interface 1223, the controller 1224 and memory interface 1225 communicate with controller memory 1221 and processor 1222 via a common bus.

The memory module 1210 receives the command and address signals C/A from the memory controller 1220, and, in response, stores and retrieves data DATA I/O to and from at least one of the memory devices on the memory module 1210. Each memory device includes a plurality of addressable memory cells and a decoder that receives the receives the command and address signals, and that generates a row signal and a column signal for accessing at least one of the addressable memory cells during programming and read operations.

Each of the components of the memory card 1200, including the memory controller 1220, electronics 1221, 1222, 1223, 1224, and 1225 included on the memory controller 1220 and the memory module 1210 can employ multiple-layered semiconductor memory devices of the type disclosed herein.

Figure 7:
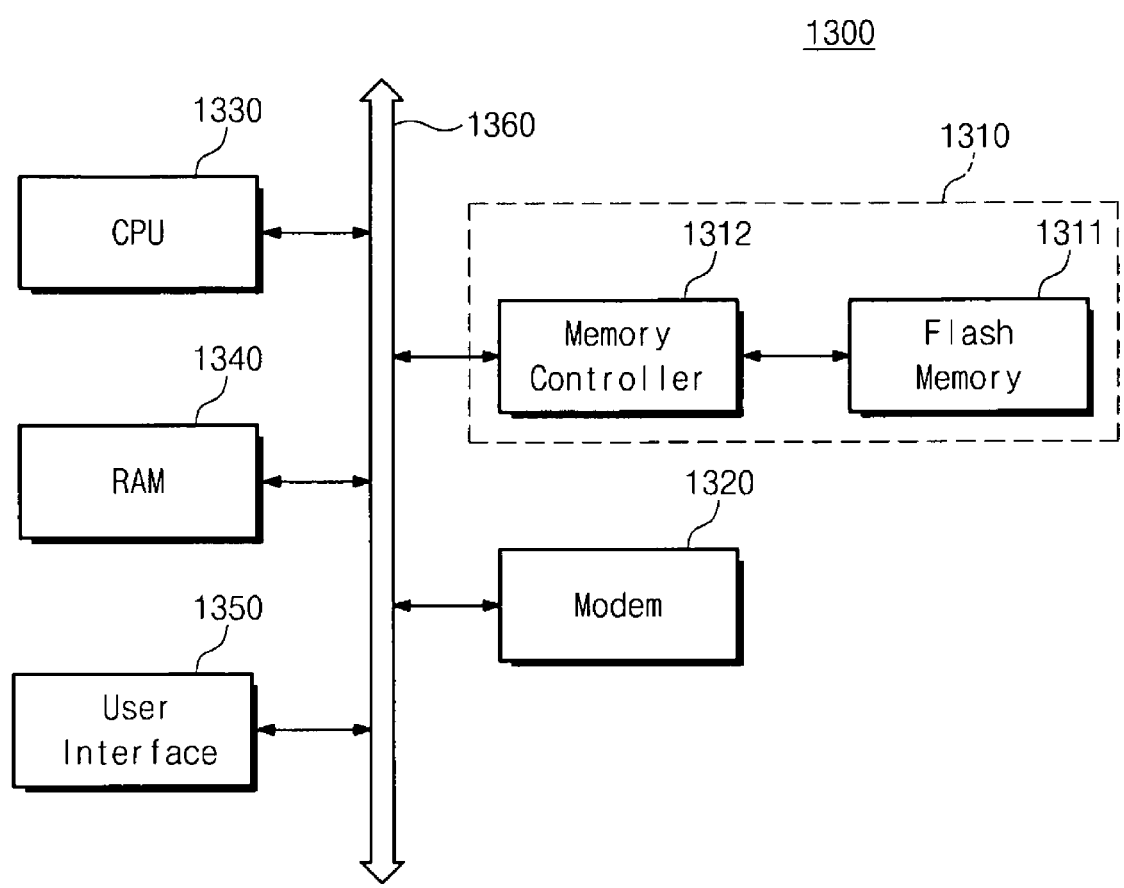
FIG. 7 is a block diagram of a memory system that employs a memory module including semiconductor devices in accordance with the embodiments of the present invention.

FIG. 7 is a block diagram of a memory system 1300 that employs a memory module 1310, for example, of the type described herein. The memory system 1300 includes a processor 1330, random access memory 1340, a user interface 1350 and a modem 1320 that communicate via a common bus 1360. The devices on the bus 1360 transmit signals to and receive signals from the memory card 1310 via the bus 1360. Each of the components of the memory system 1300, including the processor 1330, random access memory 1340, user interface 1350 and modem 1320 along with the memory card 1310 can employ vertically oriented memory devices of the type disclosed herein. The memory system 1300 can find application in any of a number of electronic applications for example, those found in consumer electronic devices such as solid state disks (SSD), camera image sensors (CIS) and computer application chip sets.

The memory systems and devices disclosed herein can be packaged in any of a number of device package types, including, but not limited to, ball grid arrays (BGA), chip scale packages (CSP), plastic leaded chip carrier (PLCC) plastic dual in-line package (PDIP), multi-chip package (MCP), wafer-level fabricated package (WFP), and wafer-level processed stock package (WSP).

While embodiments of the invention have been particularly shown and described with references to preferred embodiments thereof, it will be understood by those skilled in the art that various changes in form and details may be made herein without departing from the spirit and scope of the invention as defined by the appended claims.

What is claimed is:

1. A multiple-layered memory device, comprising:
a first memory device layer comprising:
    a first substrate including a first memory cell region, the first memory cell region including a first well positioned in an upper region thereof and a second well positioned in the first well, the first substrate comprising a semiconducting material doped with impurity of a first type, the first well comprising a semiconducting material doped with impurity of a second type opposite the first type, and the second well comprising a semiconducting material doped with impurity of the first type, a first active region of the first substrate being defined by the second well; and
    multiple first cell strings arranged on the first substrate in the first active region; and
a second memory device layer on the first memory device layer comprising:
    a second substrate including a second memory cell region, the second substrate including only a single well in the second memory cell region, the single well of the second memory cell region comprising a semiconducting material doped with impurity of one of the first type and second type, the single well defining a second active region in the second memory cell region of the second substrate; and
    multiple second cell strings arranged on the second substrate in the second active region.

2. The multiple-layered memory device of claim 1 wherein the first type of impurity is n-type and wherein the second type of impurity is p-type.

3. The multiple-layered memory device of claim 1 wherein the first type of impurity is p-type and wherein the second type of impurity is n-type.

4. The multiple-layered memory device of claim 1 wherein the semiconducting material of the single well of the second substrate is doped with impurity of the first type.

5. The multiple-layered memory device of claim 1 wherein at least one of the first and second memory device layers further includes a peripheral region.

6. The multiple-layered memory device of claim 5 wherein the first memory device layer further includes a first peripheral region including first peripheral transistors.

7. The multiple-layered memory device of claim 5 wherein the second memory device layer further includes a second peripheral region including second peripheral transistors.

8. The multiple-layered memory device of claim 7 wherein the second peripheral region of the second memory device layer is physically isolated from the second cell strings of the second active region.

* * * * *